United States Patent [19]

Sirocka et al.

[11] 3,995,177

[45] Nov. 30, 1976

[54] ELECTRONIC WATCH

[75] Inventors: Richard L. Sirocka; David F. Broxterman, both of Sunnyvale, Calif.

[73] Assignee: Fairchild Camera and Instrument Corporation, Mountain View, Calif.

[22] Filed: May 9, 1974

[21] Appl. No.: 468,782

Related U.S. Application Data

[62] Division of Ser. No. 320,223, Jan. 2, 1973, Pat. No. 3,815,354.

[52] U.S. Cl. .......... 307/264; 307/297; 323/4; 323/22 T

[51] Int. Cl.[2] .......... H03K 1/14; G05F 1/46

[58] Field of Search .......... 307/296, 297, 264; 323/4, 22 T

[56] References Cited

UNITED STATES PATENTS

| | | | |
|---|---|---|---|
| 2,968,738 | 1/1961 | Pintell | 307/297 X |
| 3,300,656 | 1/1967 | Meier et al. | 307/297 |
| 3,327,199 | 6/1967 | Gardner et al. | 307/297 X |

*Primary Examiner*—John Zazworsky
*Attorney, Agent, or Firm*—Alan H. MacPherson; Henry K. Woodward; J. Ronald Richbourg

[57] ABSTRACT

A regulated voltage converter for converting a relatively low voltage to a relatively high voltage. The converter includes a voltage converter for converting a relatively low voltage to a relatively high voltage, a constant current source, reference means coupled to the constant current source and the voltage converter for providing a reference voltage related to the relatively high voltage, a threshold detector coupled to the reference means for generating a control signal when the output of the voltage converter drops below a predetermined threshold value, a sense and enable means responsive to the appearance of the control signal for enablng the voltage converter, and sample means coupled to the constant current source, the threshold detector and the sense and enable means for periodically enabling the operation of these elements. The duration of the enabling period is small relative to the period therebetween.

6 Claims, 3 Drawing Figures

OSC.
DIVIDER
TIME KEEPING UNIT
DECODER UNIT
LEVEL CONV.
GATE
SHAPER
REGULATED VOLTAGE CONVERTER
LOW VOLTAGE SOURCE
RESET
1 HZ
64 HZ
32 HZ

ELECTRONIC WATCH

CROSS REFERENCE TO RELATED CASES

This application is a divisional of commonly assigned patent application, Ser. No. 320,223, filed Jan. 2, 1973 ,now Pat. No. 3,815,354, for "ELECTRONIC WATCH", the disclosure of which is hereby incorporated by reference.

BACKGROUND OF THE INVENTION

This invention is directed to a regulated voltage converter for use in the electronic watch disclosed in the above reference patent application. The referenced electronic watch is designed to consume extremely small amounts of electrical power during operation so that the useful lifetime of a battery power source is considerably prolonged over conventional electronic watches. The watch is composed of electronic circuits which are operated at a relatively low voltage, e.g. 1.5 volts DC, and other electronic circuits which are operated at a relatively high voltage, e.g. approximately 15 volts DC. The low voltage portion circuitry generates low voltage control signals which are converted to relatively high voltage control signals in order to drive a liquid crystal display.

The electronic watch thus requires a voltage converter for providing the relatively high voltage necessary to operate the liquid crystal display unit and the other high voltage circuitry. Moreover, this voltage converter must be regulated to insure that the relatively high output voltage generated is maintained at a magnitude at which the liquid crystal display will operate in an optimal error free manner and further requires that only small amounts of power are needed to operate the voltage converter.

SUMMARY OF THE INVENTION

The invention comprises a regulated voltage converter for converting a relatively low voltage to a relatively high voltage while consuming little electrical power and maintaining the high voltage above a predetermined threshold. In the preferred embodiment, the voltage converter comprises C MOS circuitry including a voltage converter for converting the relatively low voltage to the relatively high voltage a constant current source, reference means coupled to the constant current source and the voltage converter for providing a reference voltage related to the relatively high voltage, a threshold detector coupled to the reference means for generating a control signal when the output of the voltage converter drops below a predetermined threshold value, a sense and enable means responsive to the appearance of the control signal for enabling the voltage converter, and sample means coupled to the constant current source, the threshold detector and the sense and enable means for periodically enabling the operation of these elements over a duty cycle which is small relative to the period between successive samples.

The threshold detector comprises a source follower transistor circuit having an input coupled to the reference means and an output, and a sensing transistor circuit having an input coupled to the source follower output and an output coupled to the input of the sense and enable means.

The sense and enable means comprises a flip-flop having a clock input coupled to the sample means and a data input coupled to the output of the threshold detector, a gate coupled to the flip-flop and enabled thereby when the flip-flop is placed in a predetermined one of two stable states by the appearance of a clock signal at the clock input and the control signal at the data input, and a source of drive signals coupled to the gate for passage therethrough when the gate is enabled to drive the voltage converter.

The sample circuit comprises a source of sample pulses having a small duration relative to the period therebetween, the source being coupled to the sense and enable circuit, and switching means having a control input coupled to the source for actuation thereby and an output terminal coupled to the constant current source and the threshold detector for enabling these last named elements in response to the generation of the sample pulses. The duration of each of the sample pulses is approximately one millisecond and the period therebetween is approximately 250 milliseconds.

For a fuller understanding of the nature and advantages of the invention, reference should be had to the following description taken in conjunction with the accompanying drawings.

DESCRIPTION OF THE PREFERRED EMBODIMENT

Figure 1:
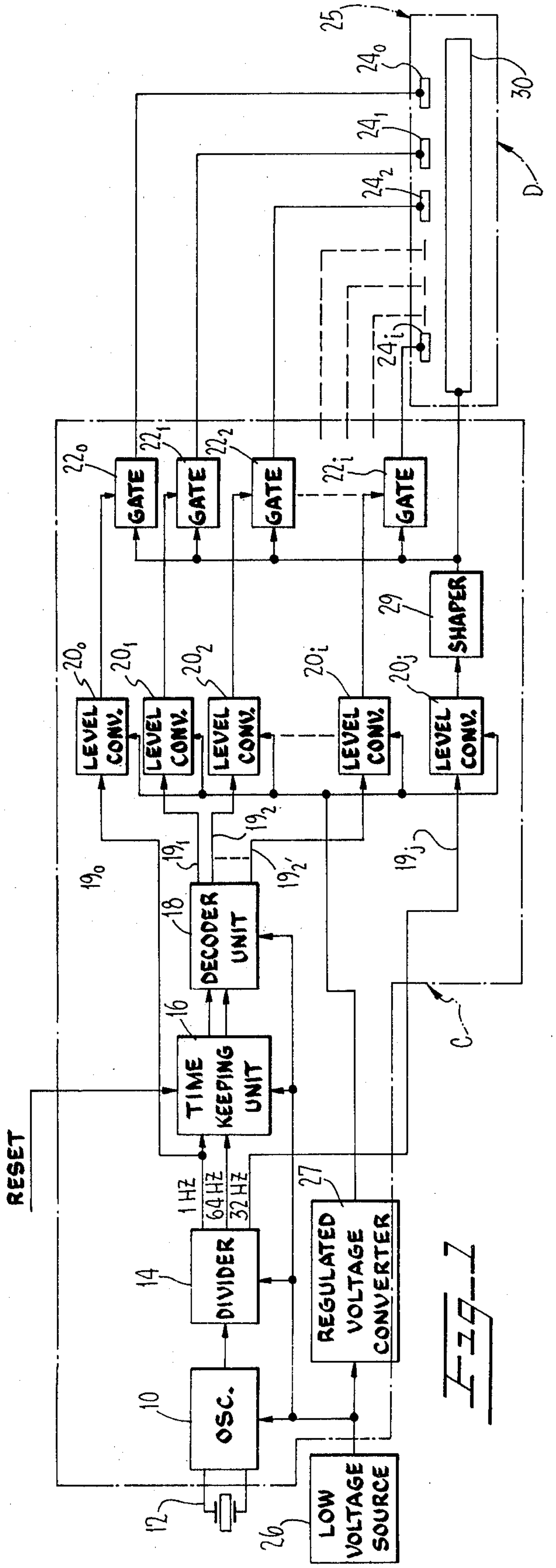
FIG. 1 is a system diagram of the electronic watch embodying the invention.

Turning now to the drawings, FIG. 1 illustrates an electronic watch embodying the invention. An oscillator 10 having a control crystal 12 provides a train of high frequency reference pulses preferably at a frequency of 32,768 HZ to the input of a frequency divider circuit 14. Frequency divider cirduit 14 divides the high frequency reference signal down to 64 HZ, 32 HZ and 1 HZ reference signals. The 64 HZ and 1 HZ reference signals are coupled to the input of a time keeping unit 16, which provides output signals representative of minutes and hours to a decoder unit 18.

Decoder unit 18 is provided with a plurality of output leads $19_1$–$19_i$ each coupled to a low voltage control input terminal of a different level converter $20_1$–$20_i$. It is noted that the 1 HZ output signal from divider 14 is also coupled directly to a level converter $20_0$.

The output of each level converter $20_0$–$20_i$ is coupled to the control input of a different transfer gate $22_0$–$20_i$. The output of each transfer gate $22_0$–$22_i$ is a high level signal for enabling a different one of a plurality of display segment control electrodes $24_0$–$24_i$ of a liquid crystal display 25.

In the preferred embodiment, liquid crystal display 25 is arranged as a plurality of conventional 7 segment digital display characters. By selectively actuating different combinations of the individual segments, the decimal digits 0–9 may be displayed. In the preferred embodiment two such characters are used for indicating minutes and two characters for indicating hours. A special segment $24_0$ is pulsed at a 1 second rate by the 1 HZ signal on lead $19_0$ to provide a visual indication to the wearer that the electronic watch is functioning properly. The structure and operation of liquid crystal displays are well known and further structural details of display 25 are accordingly omitted to avoid prolixity. Such displays are characterized by relatively low current consumption compared to light emitting diode displays or other known types of displays suitable for use as time indicators. However, for proper operation a liquid crystal display requires the application of a relatively high enabling potential between a given segment $24_i$ and the common electrode 30. Moreover, this relatively high enabling potential is preferably applied in an A.C. mode as described below in order to prolong the life of the display.

As will be apparent, the number of level converters $20_0$–$20_i$, transfer gates $22_0$–$22_i$ and display segment control electrodes $24_0$–$24_i$ is determined by the number of desired reference characters and the number of segments per character. To avoid needless repetition, the majority of such elements have been indicated in the FIG. 1 diagram by broken lines.

A low voltage source 26 providing a source voltage $V_D$ of approximately 1.5 volts DC in the preferred embodiment is coupled to the supply voltage input of oscillator 10, divider unit 14, time keeping unit 16 and decoder unit 18. Low voltage source 26 is also coupled to a regulated voltage converter 27 which converts the relatively low voltage from source 26 to a relatively high voltage of the order of approximately 15 volts DC in the preferred embodiment. The output from regulated voltage converter 27 is coupled to the supply voltage input of level converters $20_0$–$20_i$, a level converter $20_j$ and a shaper 29. The high level output of the shaper 29 is coupled to the transfer inputs of transfer gates $22_0$–$22_i$ and to common electrode 30 of liquid crystal display 25.

As will now be apparent, oscillator 10, divider 14, time keeping unit 16 and decoder 18 are all powered by the relatively low voltage $V_D$ from source 26. Since these units are all well known to those skilled in the art their details have been omitted to avoid prolixity. These units are preferably implemented by CMOS circuitry. As will be evident to those skilled in the art, circuits designed in accordance with the principles of CMOS (complementary metal oxide semiconductor) technology utilize opposite conductivity type transistors arranged in such a manner that current is only drawn during extremely small switching periods. Thus, such circuits require extremely small amounts of current for proper operation. In addition, such circuits can readily be designed to function properly from extremely low supply voltage. Thus, low voltage source 26 may comprise any one of a number of commercially available 1.5 volt DC batteries.

In operation, the train of high frequency reference pulses from oscillator 10 is divided down by divider 14 to the 64 Hz, 32 Hz and 1 Hz time reference signals. The 1 Hz reference signals are applied to timekeeping unit 16 which provides a minutes and hours count in response thereto. The minutes and hours signals from time keeping unit 16 are decoded by decoder unit 18 into low level signals on leads $19_1$–$19_i$ for specifying the individual segments $24_1$–$24_i$ of liquid crystal display 25 which are to be actuated in order to provide a visual time indication. The low level 1 Hz reference signals on lead $19_0$ are also utilized to specify the actuation of seconds segment $24_0$ of liquid crystal display 25.

Level converters $20_0$–$20_i$ and $20_j$, transfer gates $22_0$–$22_i$ and shaper 29 are all operated at a relatively high potential $V_D$, provided by regulated voltage converter 27. Level converters $20_0$–$20_i$ convert the low level control signals at their respective inputs $19_0$–$19_i$ to high level control signals for operating transfer gates $22_0$–$22_i$. Level converter $20_j$ converts the low level 32 Hz control signal present on input lead $19_j$ to high level 32 Hz signals. These high level signals from level converter $20_j$ are shaped by shaper 29 to provide high level 32 Hz segment actuation signals with sharply defined leading and trailing edges. The segment actuation signals are coupled through transfer gates $22_0$–$22_i$ to segments $24_0$–$24_i$ and directly to common electrode 30 of liquid crystal display 25. Transfer gates $22_0$–$22_i$ control the phase of the segment actuation signals coupled therethrough with reference to the phase of the segment actuation signal coupled directly to common electrode 30. When the segment actuation signals on a given segment $24_i$ and common electrode 30 are in phase, that segment is not displayed; when segment actuation signals are out of phase that segment is actuated. Thus, various segments of the minutes and hours digit characters are displayed or not depending on the low level output signals on leads $19_1$–$19_i$ from decoder unit 18. In this manner, the various digits indicating minutes and hours are displayed.

Figures 2, 3:
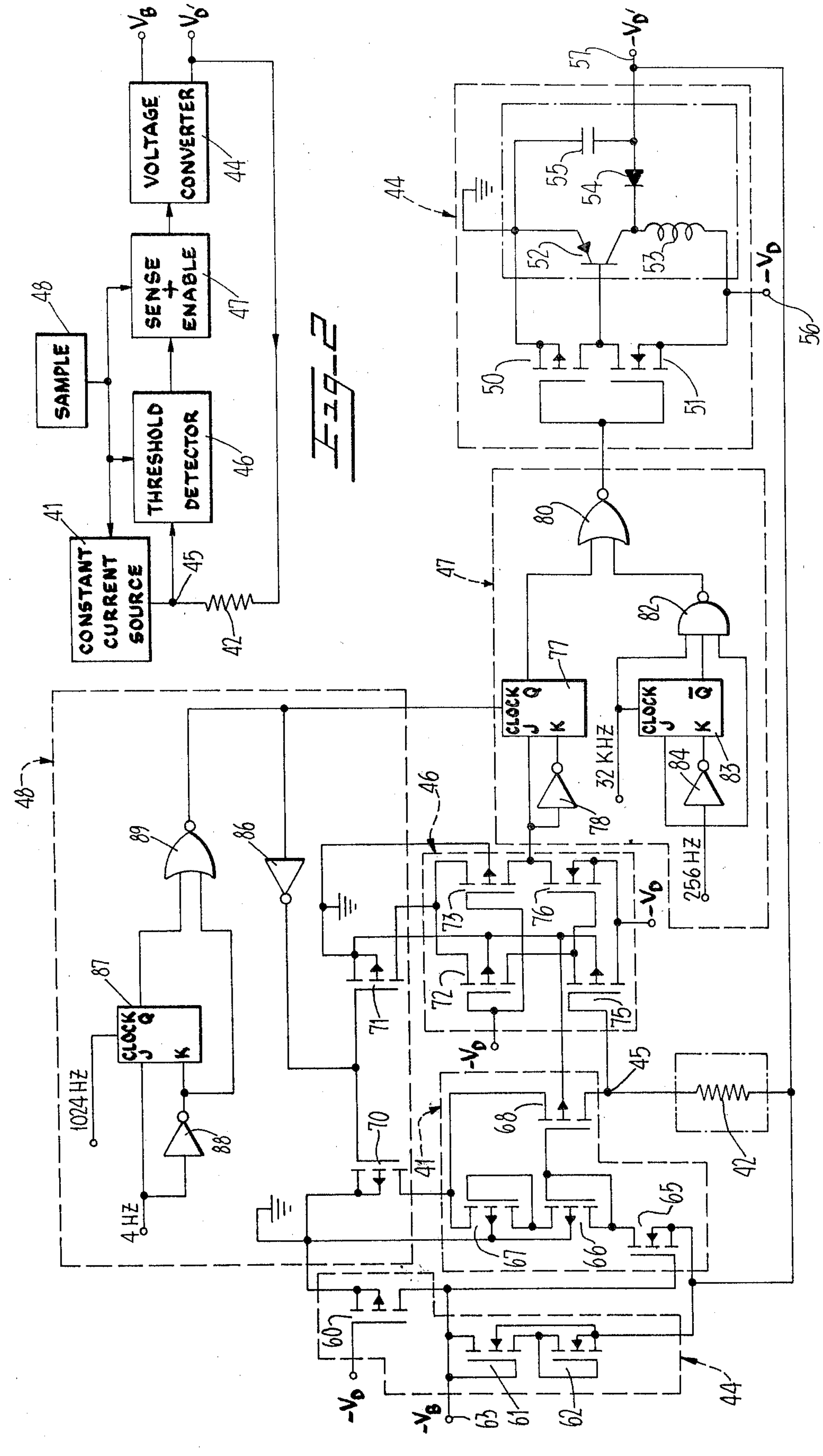
FIG. 2 is a block diagram of the preferred embodiment of the invention.
FIG. 3 is a circuit diagram of the preferred embodiment of FIG. 2.

FIG. 2 shows the preferred embodiment of the regulated voltage converter of the present invention in block diagram form. A constant current source 41 supplies a small constant current to a voltage dropping resitor 42. In the preferred embodiment the approximate value of this current is 1 microamp. The opposite end of resistor 42 is coupled to the relatively high voltage output $V_D'$ of a voltage converter 44. Since the current through resistor 42 is substantially constant, the voltage drop thereacross is also constant. Thus, any variation in the magnitude of $V_D'$ results in a linear variation of the voltage $V_t$ at junction 45, i.e. $V_t - V_D' = K$ a constant. The voltage $V_t$ at junction 45 is sensed by a threshold detector 46 which provides an output signal whenever the magnitude of voltage $V_t$ falls below a first predetermined value, indicating that the magnitude of voltage $V_D'$ has fallen below a second predetermined value linearly related to the first predetermined value by the constant K. A sense and enable circuit 47 enables voltage converter 44 whenever the output of threshold detector 46 indicates that the magnitude of voltage $V_D'$ has fallen below the predetermined value. When enabled, voltage converter 44 converts the relatively low voltage $V_D$ from low voltage source 26 to a relatively high voltage $V_D'$. A sample circuit 48 controls constant current source 41, threshold detector 46 and sense and enable circuit 47 to provide periodic, interrupted operation of these elements. In the preferred embodiment, a sampling rate of 4 Hz is employed, the actual sample period being 1 millisecond. Other sampling rates and periods may be employed as desired. As noted above, in the preferred embodiment the relative magnitudes of $V_D$ and $V_D'$ are approximately 1.5 volts DC and 15 volts DC respectively.

Voltage converter 44 also converts relatively low voltage $V_D$ to a biasing voltage $V_B$ having a magnitude of approximately 1.5 volts DC below the magnitude of $V_D'$. In the preferred embodiment bias voltabe $V_B$ is derived from voltage $V_D'$ and thus is not separately sampled and replenished. If desired, however, separate sensing and replenishing circuitry may be employed for voltage $V_B$. As discussed more fully below, voltage $V_B$ provides a bias voltage for the operation of level converters $20_0$–$20_i$, $20_j$.

FIG. 3 is a schematic illustrating the actual circuitry employed in the preferred embodiment for implementing regulated voltage converter 27 of FIG. 2. In FIG. 3, the elements comprising the various blocks shown in FIG. 2 are enclosed in broken rectangles bearing the same reference numeral.

Voltage converter 44 may be considered as comprising a first portion depicted at the right of the FIG. for generating voltage $V_D'$ and a second portion depicted at the left of the FIG. for generating voltage $V_B$. The first portion comprises a pair of complmentary MOS transistors 50, 51 connected in a push-pull buffer configuration for providing a high driving current to a discreet transistor 52. Transistor 52 together with an inductance 53, a rectifying diode 54 and a capacitor 55 comprise a voltage ringing circuit for converting the relatively low voltage $V_D$ at terminal 56 to a relatively high voltage $V_D'$ at terminal 57. Transistor 50 is normally biased on and transistor 51 is normally biased off by the quiescent low level input signal to their commonly connected gates. A ground potential is thus applied through transistor 50 to the base of discreet transistor 52, maintaining this element non-conductive. When the level of the signal coupled to the gates of transistors 50, 51 changes, the states of these two elements reverse. Thus, relatively low potential $V_D$ from terminal 56 is applied through transistor 51 to the base the remaining data input of discreet transistor 52 turning this element on, thereby permitting current to flow through inductor 53. When the level of the gate input signal to transistors 50, 51 reverts to the quiescent level, these elements again reverse states, turning off discreet transistor 52. The change of current through inductor 53 causes the development of a high voltage thereacross, which is rectified by diode 54 and stored by capacitor 55. After several initial cycles, the voltage at terminal 57 builds up to the desired magnitude $V_D'$. In this manner, this first portion of voltage converter 44 converts the relatively low supply voltage $V_D$ from low voltage source 26 to the relatively high voltage $V_D'$ present on terminal 57.

The second portion of voltage converter 44 comprises a P-type MOS transistor 60 which is permanently biased on by voltage $V_D$ to supply current to a pair of N-type MOS transistors 61, 62 configured as shown. The source terminal of lower transistor 62 is coupled to voltage $V_D'$. Transistors 61, 62 provide a constant voltage drop to voltage $V_D'$ to establish bias voltage at terminal 63.

Constant current source 41 includes an N-type MOS transistor 65 and a pair of P-type MOS transistors 66, 67 configured as shown as the mirror image of transistors 60, 61, 62 to provide a constant voltage to the gate of a P-type MOS transistor 68. Transistor 68 provides a constant current to a first terminal of resistor 42 whenever a first P-type MOS switching transistor 70 is turned on in the manner described below. As noted above, the opposite terminal of resistor 42 is coupled to voltage $V_D'$.

Sense and Enable circuit 47 includes a pair of P-type MOS transistors 72, 73 which are permanently biased on by voltage $V_D$ applied to their respective gates whenever a second P-type MOS switching transistor 71 is switched on in the manner described below. Transistor 72 serves as a load for a P-type MOS transistor 75 connected as a source follower, while transistor 73 serves as a load for an N-type MOS sensing transistor 76. Transistor 75 provides a voltage drop to voltage $V_t$ at junction 45 so that the voltage variations on the gate of sensing transistor 76 fall within an operative range. In addition, the voltage drop provided by source follower transistor 75 ensures that the voltage on junction 45 remains within a range that maintains the operation of transistor 68 in the constant mode. So long as the magnitude of voltage $V_D'$ is not below the predetermined threshold value, sensing transistor 76 is biased off by the voltage present at the gate thereof. However, when the magnitude of voltage $V_D'$ drops below this threshold value, sensing transistor 76 is biased on and the normally high signal at the output thereof drops to a low level.

The output from sensing transistor 76 is coupled directly to a first data input of a flip-flop 77 and through an inverter 78 to the remaining data input thereof. The clock input signal to flip-flop 77 is a train of 4 Hz pulses each approximately 1 millisecond in duration obtained from sample circuit 48, described more fully below. Flip-flop 77 provides a control input signal to an inverting OR gate 80 which provides enabling control signals to the first portion of voltage converter 44.

The other input to inverting OR gate 80 is obtained from the output of an inverting AND gate 82. The inputs to inverting AND gate 82 are a 256 Hz and a 32K Hz pulse train, obtained from appropriate stages of divider circuit 14 of FIG. 1, and the $\overline{Q}$ output of a flip-flop 83, which is a J-K flip-flop in the preferred embodiment. The 256 Hz pulse train is applied directly to a firt data input of flip-flop 83 and through an inverter 84 to thereof. As will be apparent to those skilled in the art, inverter 84, flip-flop 83 and inverting AND gate 82 comprise a leading edge detector which develops negative-going pulse signals of approximately 15 microseconds duration each at a rate of 256 Hz from the 256 Hz and the 32K Hz pulse trains. Thus, when flip-flop 77 is in the reset state, inverting OR gate 80 transmits these pulse signals to the commonly-connected gates of transistors 50, 51 of voltage converter 44. Conversely, when flip-flop 77 is set, inverting OR gate 80 blocks the transmission of these pulse signals to voltage converter 44.

Sample circuit 48 comprises a sample pulse generator, an inverter 86 and the aforementioned first and second switching transistors 70, 71. The sample pulse generator comprises a flip-flop 87, which is a J-K flip-flop in the preferred embodiment, an inverter 88 and an inverting OR gate 89. A 4 Hz pulse train is coupled directly to a first data input of flip-flop 87 and through inverter 88 to the remaining data input of flip-flop 87. A 1,024 Hz pulse train is applied to the clock input of flip-flop 87. Both pulse trains are obtained from appropriate stages of divider circuit 14 of FIG. 1. The Q output of flip-flop 87 is coupled to the input of inverting OR gate along with the inverted 4 Hz pulse train. As will be apparent to those skilled in the art, inverter 88 flip-flop 87 and inverting OR gate 89 comprise a leading edge detector which develops positive-going pulse signals of approximately 1 millisecond duration each at a rate of 4 Hz from the 4 Hz and 1,024 Hz pulse trains. As noted above, these pulse signals are applied directly to the clock input of flip-flop 77. Thus, the input to flip-flop 77 is sampled 4 times per second. These pulse signals are also inverted by inverter 86 and applied to the gates of switching transistors 70, 71. Since switching transistors 70, 71 enable constant current source 41 and threshold detector 46, respectively, these circuits are each enabled concurrently for 1 millisecond at the rate of 4 times per second in synchronism with the sampling of flip-flop 77.

In operation, when power from voltage source 26 of FIG. 1 is first applied to the various $V_D$ terminals of regulated voltage converter 27, the voltage at terminal 57 lies below the predetermined threshold value. Sensing transistor 76 is biased on and flip-flop 77 is reset by the first clock pulse, thereby enabling inverting OR gate 80. The 256 Hz train of 15 microsecond duration pulses is transmitted by inverting OR gate 80, thereby enabling voltage converter 44 to develop voltage $V_D'$. As the magnitude of the voltage at junction 45 rises with the magnitude of the voltage on terminal 57, source follower transistor 75 is eventually biased on, but sensing transistor 76 remains biased on, leaving flip-flop 77 reset. When the magnitude of the voltage at terminal 57 reaches the predetermined threshold value, sensing transistor 76 is biased off and flip-flop 77 is set by the succeeding clock pulse, blocking inverting OR gate 80. Thereafter, inverting OR gate 80 remains blocked until the magnitude of voltage $V_D'$ drops below the predetermined threshold value, causing sensing transistor 76 to be biased on, which in turn enables flip-flop 77 to be reset by a succeeding clock pulse. During this operation, the magnitude of the voltage $V_B$ at terminal 63 follows the variations in the magnitude of the voltage on terminal 57.

The above described operation of regulated voltage converter 27 proceeds in an interrupted manner due to the operation of switching transistors 70, 71, which enables constant current source 41 and threshold detector 46 only for 1 millisecond intervals at the rate of 4 Hz.

As will now be apparent to those skilled in the art, regulated voltage converter 27 provides an extremely well regulated high voltage $V_D'$ and a related bias voltage $V_B$ required for the operation of level converters $\mathbf{20_0}$–$\mathbf{20_i}$, $\mathbf{20_j}$ and liquid crystal display 25. The intermittant operation of constant current source 41 and threshold detector 46, the small duty cycle provided by sample circuit 48 and the complementary transistor drive configuration of voltage converter 44 all serve to reduce the power consumption of regulated voltage converter 27 well below that required for prior art voltage converter circuits providing conversion of a relatively low voltage to a relatively high voltage. The power consumption of regulated voltage converter 27 is further reduced by the use of CMOS circuitry for implementing flip-flops 77, 83 and 87, and the use of MOS devices for the elements as shown and for the inverters and gates symbolically illustrated.

While the above provides a full and complete disclosure of the preferred embodiment of the invention, various modifications, alternate constructions and equivalents may be employed without departing from the true spirit and scope of the invention. Therefore, the above description and illustrations should not be construed as limiting the scope of the invention which is solely defined by the appended claims.

What is claimed is:

1. A regulated voltage converter for converting a relatively low voltage to a relatively high voltage comprising:

a voltage converter for converting said relatively low voltage to said relatively high voltage;

a constant current source;

reference means coupled to said constant current source and said voltage converter for providing a reference voltage related to said relatively high voltage;

a threshold detector coupled to said reference means for generating a control signal when the output of said voltage converter drops below a predetermined threshold value;

a sense and enable means responsive to the appearance of said control signal for enalbing said voltage converter; and sample means coupled to said constant current source, said threshold detector and said sense and enable means for periodically enabling the operation thereof, the duration of such enabling period being small relative to the period therebetween.

2. The apparatus of claim 1, wherein said reference means comprises an electrical resistance device.

3. The apparatus of claim 1 wherein said threshold detector comprises a source follower transistor circuit having an input coupled to said reference means and an output, and a sensing transistor circuit having an input coupled to said source follower output and an output coupled to the input of said sense and enable means.

4. The apparatus of claim 1, wherein said sense and enable means comprises a flip-flop having a clock input coupled to said sample means and a data input coupled to the output of said threshold detector, a gate coupled to said flip-flop and enabled thereby when said flip-flop is placed in a predetermined one of two stable states by the appearance of a clock signal at said clock input and said control signal at said data input, and a source of drive signals coupled to said gate for passage therethrough when said gate is enabled to drive said voltage converter.

5. The apparatus of claim 1, wherein said sample means comprises a source of sample pulses having a small duration relative to the period therebetween, said source being coupled to said sense and enable circuit, and switching means having a control input coupled to said source for actuation thereby and an input terminal coupled to said constant current source and said threshold detector for enabling these last named elements in response to the generation of said sample pulses.

6. The apparatus of claim 5, wherein the duration of each of said sample pulses is approximately one millisecond and the period therebetween is approximately 250 milliseconds.

* * * * *